United States Patent
Ishita et al.

(10) Patent No.: US 9,536,707 B2
(45) Date of Patent: Jan. 3, 2017

(54) ETCHING METHOD OF MULTILAYERED FILM

(71) Applicant: Tokyo Electron Limited, Tokyo (JP)

(72) Inventors: Ryuuu Ishita, Miyagi (JP); Yusuke Saitoh, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/817,463

(22) Filed: Aug. 4, 2015

(65) Prior Publication Data
US 2016/0042919 A1 Feb. 11, 2016

(30) Foreign Application Priority Data

Aug. 8, 2014 (JP) ................ 2014-162811

(51) Int. Cl.
*C03C 15/00* (2006.01)
*H01J 37/32* (2006.01)
*H01L 21/311* (2006.01)
*H01L 21/3213* (2006.01)

(52) U.S. Cl.
CPC .... *H01J 37/32165* (2013.01); *H01J 37/32091* (2013.01); *H01L 21/31116* (2013.01); *H01L 21/32137* (2013.01)

(58) Field of Classification Search
CPC .............. H01J 37/3244; H01J 37/32009; H01J 21/31116; H01J 21/32137
USPC ................... 216/37, 67; 438/689–694
See application file for complete search history.

(56) References Cited

U.S. PATENT DOCUMENTS

| | | | | |
|---|---|---|---|---|
| 2009/0191711 A1* | 7/2009 | Rui | ........................ | G03F 7/40 438/695 |
| 2013/0059450 A1* | 3/2013 | Le Gouil | ............ | H01L 21/3065 438/715 |

* cited by examiner

*Primary Examiner* — Duy Deo
*Assistant Examiner* — Maki Angadi
(74) *Attorney, Agent, or Firm* — Pearne & Gordon LLP

(57) ABSTRACT

An etching method of etching a multilayered film includes etching a multilayered film by generating plasma within a processing vessel of a plasma processing apparatus. In the etching of the multilayered film, a first processing gas containing a hydrogen gas, a hydrogen bromide gas, a fluorine-containing gas, a hydrocarbon gas, a hydrofluorocarbon gas and a fluorocarbon gas is supplied from a first supply unit configured to supply a gas toward a central region of the processing target object and a second supply unit configured to supply a gas toward outer region than the central region; a second processing gas containing a hydrocarbon gas and a fluorocarbon gas is supplied from either one of the first supply unit and the second supply unit; and the first processing gas and the second processing gas are excited.

11 Claims, 7 Drawing Sheets

|  | EXPERIMENTAL EXAMPLE | | COMPARATIVE EXAMPLE | |
| --- | --- | --- | --- | --- |
|  | CENTER | EDGE | CENTER | EDGE |
| INCLINATION ANGLE θ (DEGREE) | 0 | 0 | 0.6 | 0.1 |
| CENTER LINE DEVIATION AMOUNT D (nm) | 1.8 | 3.2 | 18.1 | 9.1 |

ETCHING METHOD OF MULTILAYERED FILM

CROSS-REFERENCE TO RELATED APPLICATION

This application claims the benefit of Japanese Patent Application No. 2014-162811 filed on Aug. 8, 2014, the entire disclosures of which are incorporated herein by reference.

TECHNICAL FIELD

The embodiments described herein pertain generally to an etching method of etching a multilayered film.

BACKGROUND

As a kind of semiconductor device, there is known a NAND type flash memory device having a three-dimensional structure. In the manufacture of this NAND type flash memory device having the three-dimensional structure, a deep hole is formed in a multilayered film, which is composed of alternately stacked two layers having different permittivities, by performing an etching process. This etching process is described in Patent Document 1.

To elaborate, in Patent Document 1, there is described a method of etching a multilayered film by exposing a processing target object, which has a mask made of silicon nitride on the multilayered film, to plasma of a processing gas containing a $CH_2F_2$ gas and a $NF_3$ gas.

Patent Document 1: U.S. Patent Application Publication No. 2013/0059450

In the above-described etching of the multilayered film, a space such as a hole is required to be formed on the entire region of the processing target object with straightness, i.e., high verticality, in a stacking direction of the multilayered film. In the method set forth in Patent Document 1, however, the verticality of the space may be degraded on a partial region of the processing target object in a diametrical direction thereof.

Thus, it is required to suppress deterioration of the verticality of the space on the partial region of the processing target object.

SUMMARY

In one exemplary embodiment, an etching method of etching a multilayered film is provided. The multilayered film includes a first film and a second film that have different permittivities and are alternately stacked on top of each other. The etching method includes preparing, within a processing vessel of a plasma processing apparatus, a processing target object having the multilayered film and a mask formed on the multilayered film; and etching the multilayered film (simply referred to as "etching of the multilayered film") by generating plasma within the processing vessel of the plasma processing apparatus. In the etching of the multilayered film, a first processing gas containing a hydrogen gas, a hydrogen bromide gas, a fluorine-containing gas, a hydrocarbon gas, a hydrofluorocarbon gas and a fluorocarbon gas is supplied from a first supply unit configured to supply a gas toward a central region of the processing target object and a second supply unit configured to supply a gas toward outer region than the central region; a second processing gas containing a hydrocarbon gas and a fluorocarbon gas is supplied from either one of the first supply unit and the second supply unit; and the first processing gas and the second processing gas are excited.

In this etching method, a protective film containing fluorocarbon originated from the fluorocarbon gas is formed on a sidewall surface of the multilayered film that forms a space formed by the etching. Further, hydrogen originated from the hydrocarbon gas suppresses the protective film from being formed in an excessively large thickness. Accordingly, a reduction of an opening size of the mask can also be suppressed and verticality of the space formed in the multilayered film can be improved. In addition, in the above etching method, the second processing gas containing the hydrocarbon gas and the fluorocarbon gas is supplied from either one of the first and second supply units. Thus, the reduction of the opening size of the mask can also be suppressed and the verticality of the space can be improved even on a partial region of the processing target object where the verticality of the space formed in the multilayered film may be degraded if only the first processing gas is supplied.

In the exemplary embodiment, the first supply unit may be configured to supply the second processing gas. The second supply unit may be configured to supply the second processing gas.

In the exemplary embodiment, the fluorocarbon gas may be a $C_3F_8$ gas, a $C_4F_6$ gas or a $C_4F_8$ gas. The hydrofluorocarbon gas may be a $CH_2F_2$ gas, a $CH_3F$ gas or a $CHF_3$ gas. Further, the fluorine-containing gas may be a $NF_3$ gas or a $SF_6$ gas. The hydrocarbon gas may be a $CH_4$ gas.

In the exemplary embodiment, the first film may be a silicon oxide film, and the second film may be a silicon nitride film. Further, the first film may be a silicon oxide film, and the second film may be a polysilicon film. The first film and the second film may be stacked in twenty-four or more layers in total.

In the exemplary embodiment, the mask may be made of amorphous carbon.

According to the exemplary embodiment described above, it is possible to suppress the verticality of the space from being degraded on a partial region of the processing target object.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Figure 1:
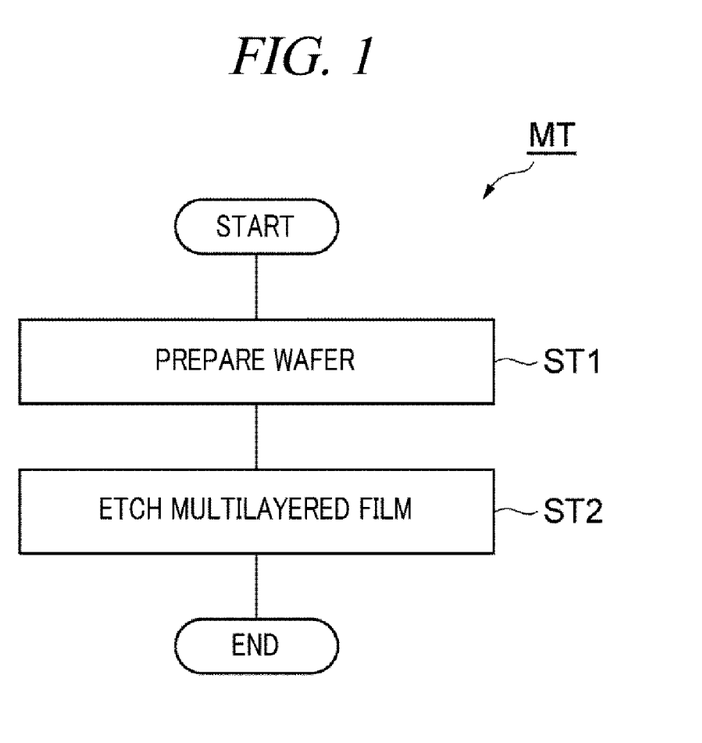
FIG. 1 is a flowchart for describing a method of etching a multilayered film according to an exemplary embodiment.

FIG. 1 is a flowchart for describing a method of etching a multilayered film according to an exemplary embodiment. The method MT shown in FIG. 1 is applicable to a manufacture of, for example, a NAND flash memory having a three-dimensional structure. The method MT includes a process ST1 and a process ST2.

Figure 2:
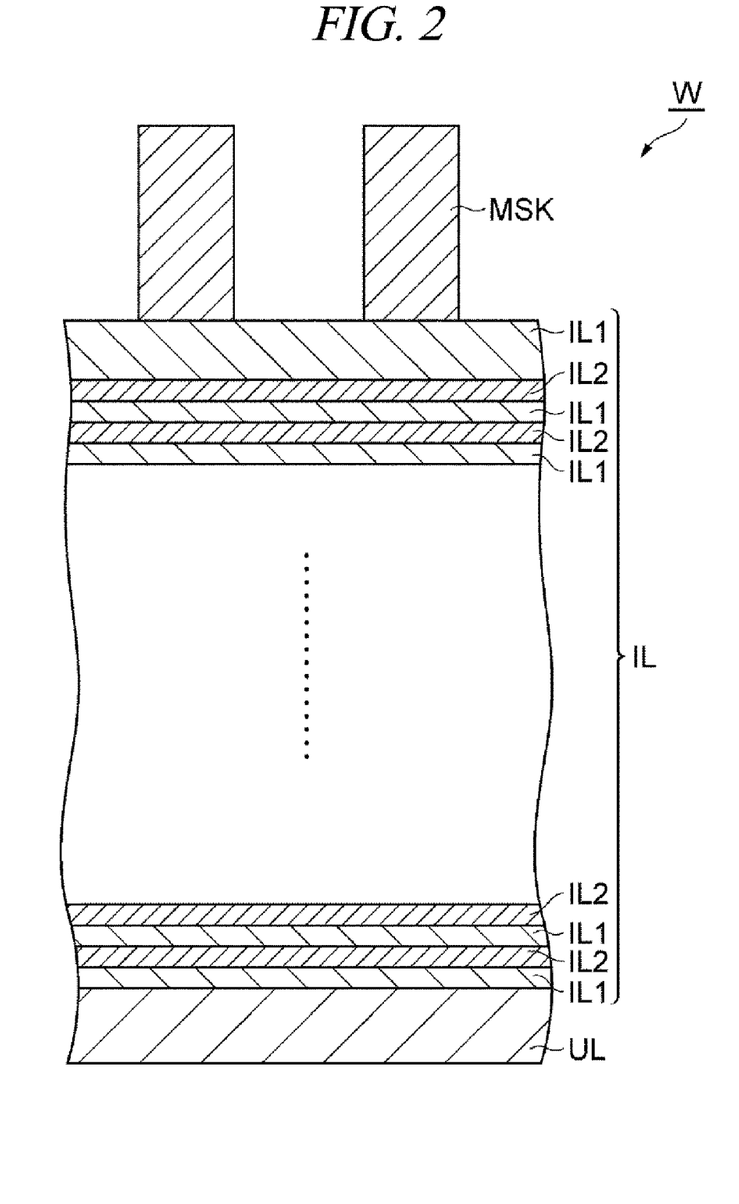
FIG. 2 is a diagram showing an example wafer prepared in a process ST1.

In the process ST1, a processing target object (hereinafter, referred to as "wafer") is prepared. FIG. 2 is a diagram illustrating an example of the wafer W prepared in the process ST1. The wafer W shown in FIG. 2 has a base layer UL, a multilayered film IL and a mask MSK. The base layer UL may be a polycrystalline silicon layer provided on a substrate. The multilayered film IL is provided on the base layer UL. The multilayered film IL has a structure in which two dielectric films IL1 and IL2 having different permittivities are alternately stacked. In the exemplary embodiment, the dielectric film IL1 may be a silicon oxide film, and the dielectric film IL2 may be a silicon nitride film. In other exemplary embodiments, the dielectric film IL1 may be a silicon oxide film, and the dielectric film IL2 may be a polysilicon film. By way of non-limiting example, a thickness of the dielectric film IL1 is in the range from, but not limited to 5 nm to 50 nm, and a thickness of the dielectric film IL2 is in the range from, but not limited to, 10 nm to 75 nm. The dielectric films IL1 and IL2 may be stacked in twenty-four or more layers in total. The mask MSK is provided on the multilayered film IL. The mask MSK has a pattern for forming a space such as a hole in the multilayered film IL. The mask MSK may be made of, by way of example, but not limitation, amorphous carbon. Alternatively, the mask MSK may be made of, for example, organic polymer.

Figure 3:
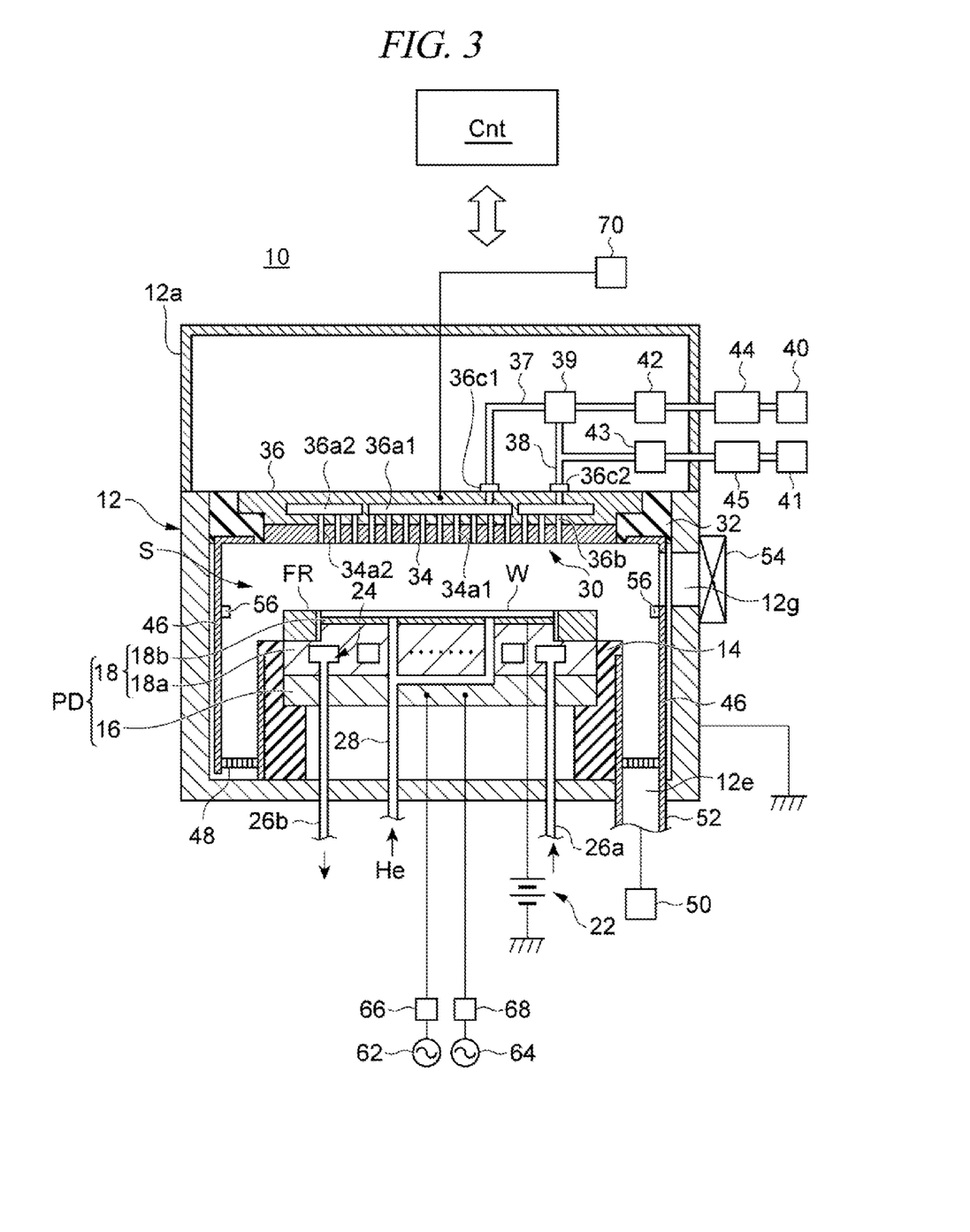
FIG. 3 is a diagram illustrating an outline of a plasma processing apparatus.

Referring back to FIG. 1, in the process ST1 of the method MT, the wafer W is prepared within a processing vessel of a plasma processing apparatus. As an example, the plasma processing apparatus may be configured as a capacitively coupled plasma processing apparatus. Below, an example of the plasma processing apparatus in which the method MT can be performed will be first explained. FIG. 3 is a diagram depicting an outline of the plasma processing apparatus and illustrates a longitudinal cross-sectional view of the plasma processing apparatus.

The plasma processing apparatus 10 shown in FIG. 3 is configured as a capacitively coupled plasma etching apparatus and includes a substantially cylindrical processing vessel 12. An inner wall surface of the processing vessel 12 is made of anodically oxidized aluminum. This processing vessel 12 is frame-grounded.

A substantially cylindrical supporting member 14 is provided on a bottom of the processing vessel 12. Within the processing vessel 12, the supporting member 14 is vertically extended from the bottom of the processing vessel 12. The supporting member 14 sustains a placing table PD provided within the processing vessel 12. To elaborate, as depicted in FIG. 3, the supporting member 14 may support the placing table PD on an inner wall surface thereof.

The placing table PD is configured to hold the wafer W on a top surface thereof. The placing table PD may include a lower electrode 16 and a supporting unit 18. The lower electrode 16 is made of a metal such as, but not limited to, aluminum and has a substantially circular plate shape. The supporting unit 18 is provided on a top surface of this lower electrode 16.

The supporting unit 18 is configured to support the wafer W and includes a base member 18a and an electrostatic chuck 18b. The base member 18a is made of a metal such as, but not limited to, aluminum and has a substantially circular plate shape. The base member 18a is provided on the lower electrode 16 and is electrically connected with the lower electrode 16. The electrostatic chuck 18b is provided on the base member 18a. The electrostatic chuck 18b has a structure in which an electrode as a conductive film is embedded between a pair of insulating layers or insulating sheets. The electrode of the electrostatic chuck 18b is electrically connected with a DC power supply 22. The electrostatic chuck 18b is configured to attract and hold the wafer W by an electrostatic force such as a Coulomb force generated by a DC voltage applied from the DC power supply 22.

A focus ring FR is provided on a peripheral portion of the base member 18a of the supporting unit 18 to surround a peripheral of the wafer W and the electrostatic chuck 18b. The focus ring FR is provided to improve etching uniformity. The focus ring FR is made of a material that is appropriately selected depending on a material of an etching target film. By way of non-limiting example, the focus ring FR may be made of quartz.

A coolant path 24 is formed within the base member 18a. The coolant path 24 constitutes a temperature control device according to the exemplary embodiment. A coolant of a preset temperature is supplied into and circulated through the coolant path 24 from an external chiller unit via pipelines 26a and 26b. By controlling the temperature of the coolant being circulated, a temperature of the wafer W held on the supporting unit 18 can also be controlled.

Further, the plasma processing apparatus 10 is also equipped with a gas supply line 28. The gas supply line 28 is configured to supply a heat transfer gas from a heat transfer gas supply unit, for example, a He gas, to between a top surface of the electrostatic chuck 18b and a rear surface of the wafer W.

In addition, the plasma processing apparatus 10 also includes an upper electrode 30. The upper electrode 30 is provided above the placing table PD to face the placing table PD. The lower electrode 16 and the upper electrode 30 are provided to be substantially parallel to each other. A processing space S in which a plasma process is performed on the wafer W is formed between the upper electrode 30 and the lower electrode 16.

The upper electrode 30 is held at a top portion of the processing vessel 12 with an insulating shield member 32 therebetween. The upper electrode 30 may include an electrode plate 34 and an electrode supporting body 36. The electrode plate 34 faces the processing space S and is provided with a plurality of first gas discharge holes 34a1 and a multiplicity of second gas discharge holes 34a2. The electrode plate 34 may be made of a low-resistance conductor or semiconductor having a low Joule heat.

The electrode supporting body 36 is configured to support the electrode plate 34 in a detachable manner, and may be made of a conductive material such as, but not limited to, aluminum. The electrode supporting body 36 may have a water-cooling structure. A first gas diffusion space 36a and a second gas diffusion space 36a2 are formed within the electrode supporting body 36. The first gas diffusion space 36a1 is a hollow space which is extended above a central region of the wafer W, i.e., above a central region of the placing table PD and has a substantially circular planar shape when viewed from the vertical direction. Further, the second gas diffusion space 36a2 is a hollow space which is partitioned from the first gas diffusion space 36a1 and is extended in a substantially ring shape outside the first gas diffusion space 36a1.

A multiple number of gas through holes 36b communicating with the first gas discharge holes 34a1 is extended downwards from the first gas diffusion space 36a1. Likewise, a multiplicity of gas through holes 36b communicating with the second gas through holes 34a2 is extended downwards from the second gas diffusion space 36a2. The first gas discharge holes 34a1 are located to face the substantially central region of the placing table PD. The first gas discharge holes 34a1 constitute a first supply unit. That is, the first supply unit is configured to supply a gas toward the central region of the wafer W. Further, the second gas discharge holes 34a2 are located outside the first gas discharge holes 34a1. The second gas discharge holes 34a2 constitute a second supply unit. That is, the second supply unit is configured to supply a gas toward an outer region than the central region of the wafer W.

Further, the electrode supporting body 36 is provided with a gas inlet opening 36c1 through which a gas is introduced into the first gas diffusion space 36a1, and the gas inlet opening 36c1 is connected with a gas supply line 37. Further, the electrode plate 36 is also provided with a gas inlet opening 36c2 through which a gas is introduced into the second gas diffusion space 36a2, and the gas inlet opening 36c2 is connected with a gas supply line 38. The gas supply lines 37 and 38 are connected with a flow splitter 39, and the flow splitter 39 is connected with a gas source group 40 via a valve group 42 and a flow rate controller group 44.

The gas source group 40 includes a multiple number of gas sources. The multiple number of gas sources are sources of plural kinds of gases contained in a first processing gas. Specifically, the multiple number of gas sources are sources of a hydrogen gas ($H_2$ gas), a hydrogen bromide gas (HBr gas), a fluorine-containing gas, a hydrocarbon gas, a hydrofluorocarbon gas and a fluorocarbon gas. As an example of the fluorine-containing gas, a $NF_3$ gas or a $SF_6$ gas may be used. As an example of the hydrocarbon gas, a $CH_4$ gas may be used. As an example of the hydrofluorocarbon gas, a $CH_2F_2$ gas, a $CH_3F$ gas or a $CHF_3$ gas may be used. As an example of the fluorocarbon gas, a $C_3F_8$ gas, a $C_4F_6$ gas or a $C_4F_8$ gas may be used. Further, the multiple number of gas sources may further include various other gas sources of, for example, a rare gas such as an Ar gas.

The multiple number of gas sources of the gas source group 40 are connected to the flow splitter 39 via corresponding flow rate controllers included in the flow rate controller group 44 and corresponding valves included in the valve group 42, respectively. Accordingly, the first processing gas from the gas sources of the gas source group 40 is split by the flow splitter 39 to be discharged into the processing space S through the first gas discharge holes 34a1 and the second gas discharge holes 34a2. Further, each of the flow rate controllers included in the flow rate controller group 44 may be implemented by a mass flow controller MFC or a FCS.

The gas supply line 38 is connected with a gas source group 41 via a valve group 43 and a flow rate controller group 45. The gas source group 41 includes two gas sources, i.e., a source of a hydrocarbon gas and a source of a fluorocarbon gas. The hydrocarbon gas may be, by way of example, but not limitation, a $CH_4$ gas, and the fluorocarbon gas may be, by way of non-limiting example, a $C_3F_8$ gas, a $C_4F_6$ gas or a $C_4F_8$ gas.

The two gas sources of the gas source group 41 are connected to the gas supply line 38 via corresponding flow rate controllers included in the flow rate controller group 45 and corresponding valves included in the valve group 43, respectively. A second processing gas from the two gas sources of the gas source group 41 is discharged into the processing space S through the second gas discharge holes 34a2. Further, the gas source group 41 may also be connected to the gas supply line 37 via the valve group 43 and the flow rate controller group 45. In such a case, the second processing gas may be discharged into the processing space S through the first gas discharge holes 34a1.

Referring back to FIG. 3, the plasma processing apparatus 10 may further include a grounding conductor 12a. The grounding conductor 12a is of a substantially cylindrical shape and is extended upwards from a sidewall of the processing vessel 12 to a position higher than the upper electrode 30.

Further, the plasma processing apparatus 10 is also equipped with a deposition shield 46. The deposition shield 46 is detachably provided along an inner wall of the processing vessel 12. The deposition shield 46 is also provided on an outer periphery of the supporting member 14. The deposition shield 46 suppresses an etching byproduct (deposit) from adhering to the processing vessel 12 and may be made of an aluminum member coated with ceramics such as $Y_2O_3$.

At a bottom portion of the processing vessel 12, a gas exhaust plate 48 is provided between the supporting member 14 and the inner wall of the processing vessel 12. The gas exhaust plate 48 may be made of, by way of example, but not limitation, an aluminum member coated with ceramics such as $Y_2O_3$. The processing vessel 12 is also provided with an exhaust port 12e under the gas exhaust plate 38, and the exhaust port 12e is connected with a gas exhaust device 50 via a gas exhaust line 52. The gas exhaust device 50 includes a vacuum pump such as a turbo molecular pump and is capable of depressurizing the inside of the processing vessel 12 to a desired vacuum level. Further, a carry-in/out opening 12g for the wafer W is formed at the sidewall of the processing vessel 12, and this carry-in/out opening 12g is opened or closed by a gate valve 54.

Further, a conductive member (GND block) 56 is provided on the inner wall of the processing vessel 12. The conductive member 56 is fixed to the inner wall of the processing vessel 12 to be disposed on a substantially level with the wafer W in a height direction. This conductive member 56 is DC-connected to the ground and has an effect of suppressing an abnormal discharge. Further, the position of the conductive member 56 may not be limited to the position shown in FIG. 3 as long as it is provided within a plasma generation region.

The plasma processing apparatus 10 further includes a first high frequency power supply 62 and a second high frequency power supply 64. The first high frequency power supply 62 is configured to generate a first high frequency power for plasma generation of a frequency ranging from 27 MHz to 100 MHz. As an example, the first high frequency power supply 62 generates a high frequency power having a frequency of 40 MHz. The first high frequency power supply 62 is connected to the lower electrode 16 via a matching unit 66. The matching unit 66 is a circuit for matching an output impedance of the first high frequency power supply 62 with an input impedance on a load side (on the side of the lower electrode 16). The first high frequency power supply 62 may also be connected to the upper electrode 30 via a matching unit 66.

The second high frequency power supply 64 is configured to generate a second high frequency power for ion attraction into the wafer W, i.e., a high frequency bias power, of a frequency in the range from 400 kHz to 13.56 MHz. As an example, the second high frequency power 64 generates a high frequency power of 3 MHz. The second high frequency power supply 64 is connected to the lower electrode 16 via a matching unit 68. The matching unit 68 is a circuit for matching an output impedance of the second high frequency power supply 64 with an input impedance on the load side (on the side of the lower electrode 16).

Further, the plasma processing apparatus 10 further includes a DC power supply unit 70. The DC power supply unit 70 is connected to the upper electrode 30. The DC power supply unit 70 is configured to generate a negative DC voltage to apply the DC voltage to the upper electrode 30.

Furthermore, in the exemplary embodiment, the plasma processing apparatus 10 may further include a controller Cnt. The controller Cnt is a computer including a processor, a memory, an input device, a display device, and so forth and is configured to control individual components of the plasma processing apparatus 10. Through the controller Cnt, an operator can input commands or the like to manage the plasma processing apparatus 10 by using the input device of the controller Cnt, and an operational status of the plasma processing apparatus 10 can be visually displayed by the display device. The memory stores therein control programs for implementing various processes in the plasma processing apparatus 10 under the control of the processor, or programs for implementing a process in each component of the plasma processing apparatus 10 according to processing conditions, i.e., processing recipes.

To elaborate, the controller Cnt outputs control signals to the flow rate controllers included in the flow rate controller groups 44 and 45, the valves included in the valve groups 42 and 43, the flow splitter 39 and the gas exhaust device 50 to control them such that the first processing gas and the second processing gas are supplied into the processing vessel 12 during the etching in the process ST2 and, also, an internal pressure of the processing vessel 12 is set to be a predetermined pressure value.

Further, the controller Cnt may also output control signals to the first and second high frequency power supplies 62 and 64 to supply the high frequency powers from the first and second high frequency power supplies 62 and 64 to the lower electrode 16. In the exemplary embodiment, the controller Cnt may output the control signals to the first and second high frequency power supplies 62 and 64 to supply the high frequency powers to the lower electrode 16 while ON and OFF of the high frequency powers are switched in a pulse shape. In addition, the controller Cnt may also output a control signal to the DC power supply unit 70 to supply a negative DC voltage, which has an absolute value larger than that of a negative DC voltage applied to the upper electrode 30 during a period during which the high frequency powers are ON, to the upper electrode 30 during a period during which the high frequency powers are OFF. Further, an ON-Off frequency of the high frequency powers from the first and second high frequency power supplies 62 and 64 is in the range of, but not limited to, 1 kHz to 40 kHz. Here, the "ON-OFF frequency of the high frequency powers" refers to a frequency having a single cycle composed of an ON period and an OFF period of the high frequency powers of the first and second high frequency power supplies 62 and 64. Further, a duty ratio indicating a ratio of the ON period of the high frequency powers with respect to the single cycle is, by way of example, but not limitation, in the range from 50% to 90%. Further, the changeover of the DC voltage of the DC power supply unit may be synchronized with the ON-OFF switchover of the high frequency power supplies 62 and 64.

Referring back to FIG. 1, the description of the method MT will be continued. In the process ST1 (Prepare wafer), the wafer W is prepared within the processing vessel of the plasma processing apparatus. When the plasma processing apparatus 10 is employed, the wafer W placed on the placing table PD is attracted to and held on the electrostatic chuck 18b. Subsequently, the process ST2 of the method MT is performed.

In the process ST2 (Etch multilayered film), a multilayered film is etched. For the purpose, in the process ST2, the first processing gas is supplied into the processing vessel of the plasma processing apparatus from both of the first supply unit and the second supply unit, and the second processing gas is supplied into the processing vessel from either one of the first supply unit and the second supply unit. Further, the internal pressure of the processing vessel is set to be a predetermined pressure. In case of using the plasma processing apparatus 10, the first processing gas is supplied into the processing vessel 12 from the first gas discharge holes 34a1 and the second gas discharge holes 34a2, and the second processing gas is supplied into the processing vessel 12 from either the first gas discharge holes 34a1 or the second gas discharge holes 34a2. Further, by operating the gas exhaust device 50, the internal pressure of the processing vessel 12 can be set to be the predetermined pressure.

The first processing gas used in the process ST2 includes a hydrogen gas ($H_2$ gas), a hydrogen bromide gas (HBr gas), a fluorine-containing gas, a hydrocarbon gas, a hydrofluorocarbon gas and a fluorocarbon gas. An example of the fluorine-containing gas may be, by way of example, but not limitation, a $NF_3$ gas or a $SF_6$ gas. An example of the hydrocarbon gas may be, but not limited to, a $CH_4$ gas. An example of the hydrofluorocarbon gas may be, by way of non-limiting example, a $CH_2F_2$ gas, a $CH_3F$ gas or a $CHF_3$ gas. An example of the fluorocarbon gas may be, but not limited to, a $C_3F_8$ gas, a $C_4F_6$ gas or a $C_4F_8$ gas. Further, the first processing gas may further include other gases, for example, a rare gas such as an Ar gas.

Further, the second processing gas used in the process ST2 includes a hydrocarbon gas and a fluorocarbon gas. The hydrocarbon gas may be, by way of example, but not limitation, a $CH_4$ gas, and the fluorocarbon gas may be, by way of non-limiting example, a $C_3F_8$ gas, a $C_4F_6$ gas or a $C_4F_8$ gas.

In the process ST2, the processing gas supplied into the processing vessel is excited. In case of using the plasma processing apparatus 10, the high frequency powers from the first and second high frequency power supplies 62 and 64 are applied to the lower electrode 16.

Various conditions in the process ST2 are as follows.
<First Processing Gas>
Flow rate of $H_2$ gas: 50 sccm to 300 sccm
Flow rate of HBr gas: 5 sccm to 50 sccm
Flow rate of $NF_3$ gas: 50 sccm to 100 sccm
Flow rate of $CH_4$ gas: 5 sccm to 50 sccm
Flow rate of $CH_2F_2$ gas: 40 sccm to 80 sccm
Flow rate of $C_4F_8$ gas: 5 sccm to 20 sccm
<Second Processing Gas>
Flow rate of $CH_4$ gas: 5 sccm to 50 sccm
Flow rate of $C_4F_8$ gas: 5 sccm to 20 sccm
Frequency of high frequency power of first high frequency power supply 62: 27 MHz to 100 MHz
High frequency power of first high frequency power supply 62: 500 W to 2700 W
Frequency of high frequency power of second high frequency power supply 64: 0.4 MHz to 13 MHz
High frequency power of second high frequency power supply 64: 1000 W to 4000 W
Pressure within processing vessel 12: 2.66 Pa to 13.3 Pa (20 mT to 100 mT)

Further, according to the exemplary embodiment, the ON-OFF switchover of the high frequency powers of the first and second high frequency power supplies 62 and 64 may be performed in a pulse shape. Further, synchronously with the ON-OFF switchover of the high frequency powers of the first and second high frequency power supplies 62 and 64, the magnitude of an absolute value of the negative DC voltage applied to the upper electrode 30 may be switched. In the present exemplary embodiment, plasma is generated while the high frequency powers are ON, and the plasma directly above the wafer W is extinguished while the high frequency powers are OFF. Furthermore, while the high frequency powers are OFF, positive ions are attracted to collide with the upper electrode 30 by the negative DC voltage applied to the upper electrode 30. Accordingly, secondary electrons are emitted from the upper electrode 30. The emitted secondary electrons modify the mask MSK to improve etching resistance of the mask MSK. Further, the secondary electrons neutralize a charged state of the wafer W. As a result, verticality of ions toward the hole formed in the multilayered film IL is improved. Example conditions regarding the ON-OFF switchover of the high frequency powers of the first and second high frequency power supplies 62 and 64 and conditions for the negative DC voltage applied to the upper electrode 30 are as follows.

Figure 4:
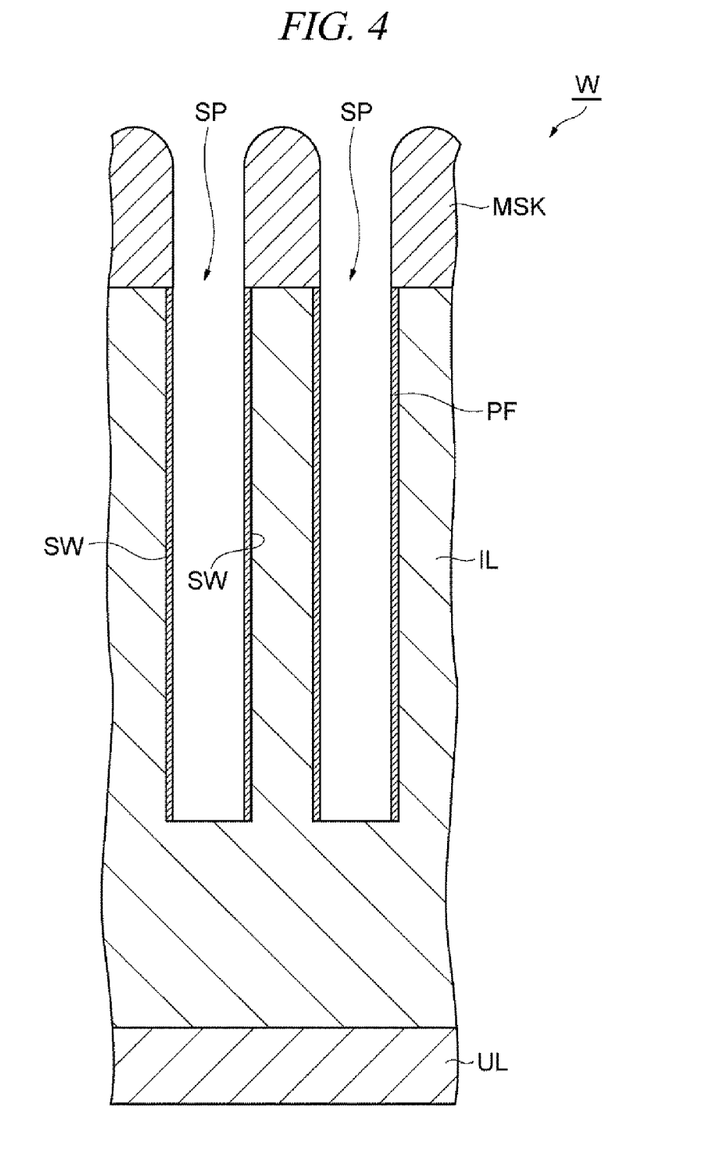
FIG. 4 is a diagram showing a wafer being etched in a process ST2.

ON-OFF frequency of high frequency powers: 1 kHz to 40 kHz
Duty ratio of ON-period of high frequency powers within a single cycle: 50% to 90%
Absolute value of negative DC voltage during ON-period of high frequency powers: 150 V to 500 V
Absolute value of negative DC voltage during OFF-period of high frequency powers: 350 V to 100 V In the process ST2, the first processing gas and the second processing gas are excited into plasma. By exposing the wafer W to active species of atoms or molecules contained in the first processing gas, the multilayered film IL of the wafer W is etched, as illustrated in FIG. 4. Further, during the etching of the process ST2, a protective film PF containing fluorocarbon originated from the fluorocarbon gas is formed on a sidewall surface SW of the multilayered film IL that forms a space SP formed by the etching. Further, hydrogen originated from the hydrocarbon gas suppresses the protective film PF from being formed in an excessively large thickness. Accordingly, a reduction of an opening size of a mask MSK can be suppressed, whereas the verticality of the space formed in the multilayered film IL can be improved. Further, in the process ST2, the second processing gas containing the hydrocarbon gas and the fluorocarbon gas is supplied from either one of the first and second supply units. Accordingly, a reduction of the opening size of the mask MSK can also be suppressed and the verticality of the space SP can be improved even on a partial region of the wafer W where the verticality of the space SP formed in the multilayered film IL may be degraded if only the first processing gas is supplied.

Further, the processing gas used in the process ST2 contains hydrogen, and the mask MSK is modified by the hydrogen. As a consequence, it is possible to maintain the shape of the mask until the etching in the process ST2 is completed. That is, a mask selectivity against the etching of the multilayered film IL can be improved.

Experimental Examples and Comparative Examples

Below, an experimental example conducted by using the method MT and a comparative example conducted for the comparison will be described.

In the experimental example, the method MT is applied to the wafer W shown in FIG. 2 by using the plasma processing apparatus 10. Further, the second processing gas is supplied from the first gas discharge holes 34a1. Meanwhile, in the comparative example, the second processing gas is not supplied, and the multilayered film IL of the wafer W is etched by supplying only the first processing gas from the first gas discharge holes 34a1 and the second gas discharge holes 34a2. Further, the other conditions for the etching of the comparative example are the same as those for the etching of the experimental example.

Figure 5:
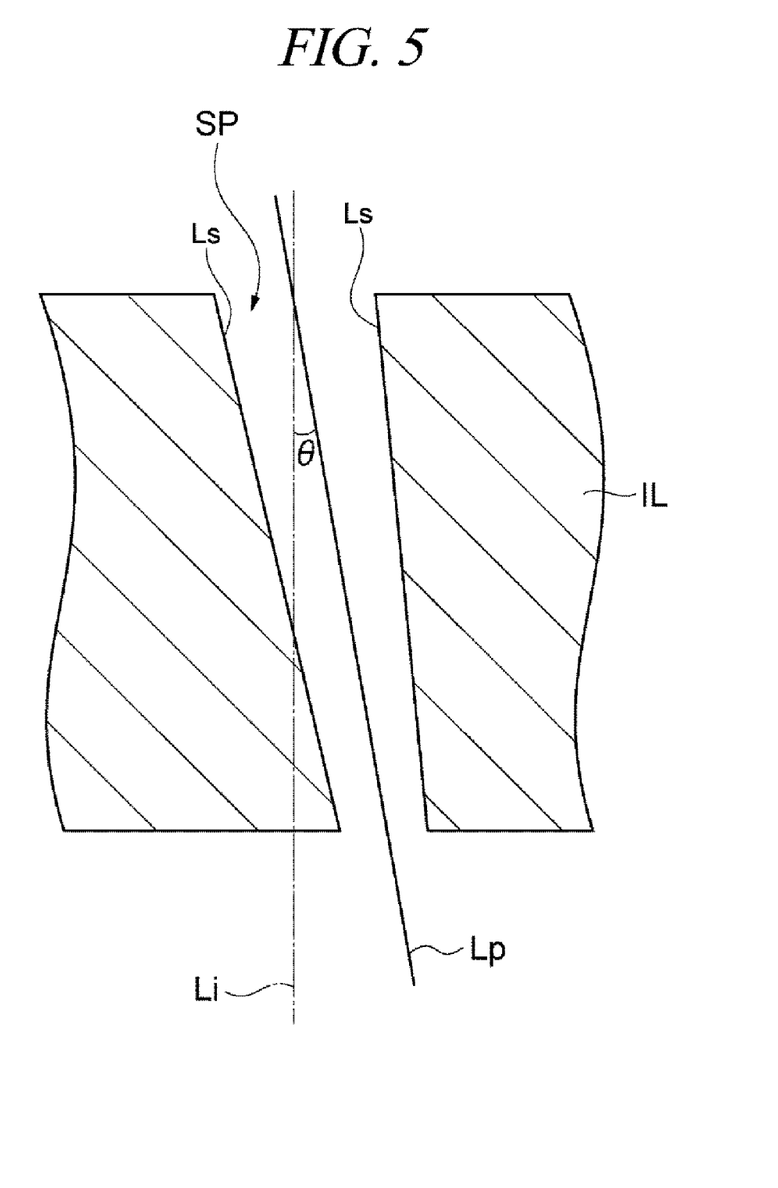
FIG. 5 is a diagram for describing inclination angles obtained in an example and a comparative example.
Figure 6:
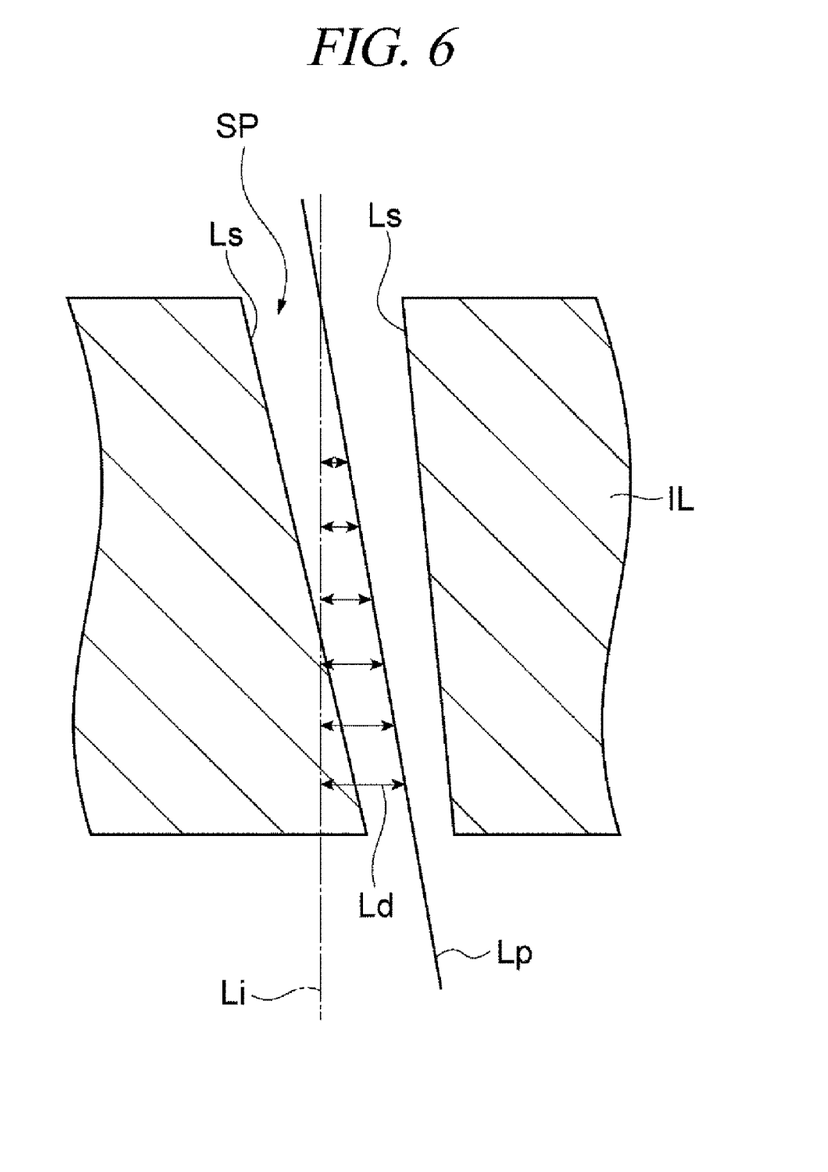
FIG. 6 is a diagram for describing a deviation amounts of a central line calculated in the experimental example and the comparative example.
Figure 7:
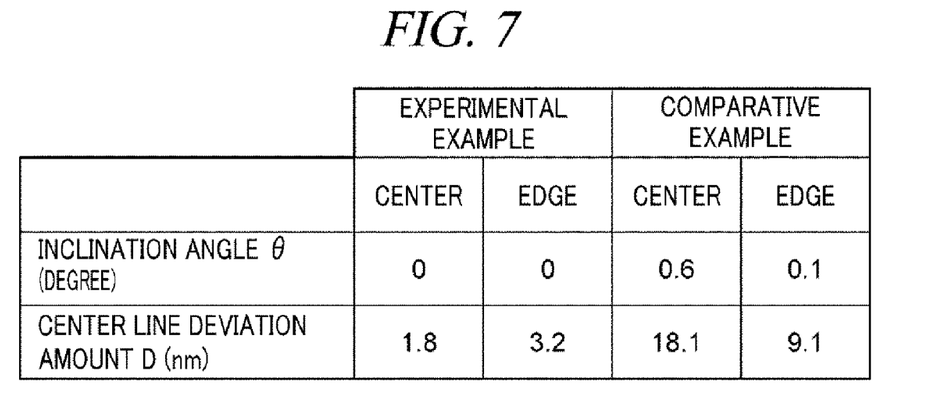
FIG. 7 is a table showing the inclination angles and the deviation amounts obtained in the experimental example and the comparative example.

For each of the wafers W to which the etching of the experimental example and the etching of the comparative example are applied, respectively, a cross sectional image of the multilayered film IL in which the space is formed by the etching is acquired, and a shape of the space is observed by using the corresponding cross sectional image. To elaborate, an inclination angle θ and a center line deviation amount D of the space SP are obtained. The inclination angle θ is obtained, as shown in FIG. 5, by measuring an angle between a center line Lp and an imaginary line Li. Here, the center line Lp refers to a central line between a pair of lines Ls that form the space SP, and the imaginary line Li refers to a line that passes through a center of a top opening of the space SP in a vertical direction. The pair of lines Ls corresponds to sidewall surfaces of the multilayered film IL that form both sides of the space SP on the cross sectional image. Further, the center line deviation amount D is obtained, as illustrated in FIG. 7, by measuring distances Ld between the center line Lp and the imaginary line Li in a horizontal direction at different positions and, then, calculating 3σ of those distances Ld. In addition, the inclination angle θ and the center line deviation amount D are obtained at a center position of the wafer W, an edge position thereof and an intermediate position between the center position and the edge position in a diametric direction of the wafer W.

FIG. 7 shows the inclination angles θ and the center line deviation amounts D obtained in the experimental example and the comparative example. As can be seen from FIG. 7, the inclination angles θ and the center line deviation amounts D of the space formed by the etching of the comparative example are found to be greatly different from regions in the diametrical direction of the wafer. The reason for this is because when supplying only the first processing gas, the protective film is not sufficiently formed on the sidewall surface, which forms the space, in the partial region of the wafer so that the sidewall surface formed in the multilayered film is horizontally etched by ions entering the space in an inclined direction. Meanwhile, the inclination angles θ and the center deviation amounts D of the space formed by the etching of the experimental example are found to be fairly smaller than the inclination angles θ and the center line deviation amounts D of the space formed by the comparative example, and, also, the differences in the inclination angles θ and the center deviation amounts D of the space between regions of the wafer in the diametrical direction are also found to be decreased. As can be seen from this result, it is found out that by supplying the second processing gas toward appropriate regions of the wafer W, it is possible to suppress the verticality of the space in a partial region of the processing target object from being degraded.

From the foregoing, it will be appreciated that various embodiments of the present disclosure have been described herein for purposes of illustration, and that various modifications may be made without departing from the scope and spirit of the present disclosure. A plasma processing apparatus is not limited to a capacitively coupled plasma processing apparatus. For example, the plasma processing apparatus may be an inductively coupled plasma processing apparatus or a plasma processing apparatus configured to generate plasma by introducing a microwave into a processing vessel through a waveguide and an antenna. Accordingly, the various embodiments disclosed herein are not intended to be limiting, with the true scope and spirit being indicated by the following claims.

We claim:

1. An etching method of etching a multilayered film including a first film and a second film that have different permittivities and are alternately stacked on top of each other, the etching method comprising:
preparing, within a processing vessel of a plasma processing apparatus, a processing target object having the multilayered film and a mask formed on the multilayered film; and
etching the multilayered film by generating plasma within the processing vessel of the plasma processing apparatus,
wherein in the etching of the multilayered film, a first processing gas containing a hydrogen gas, a hydrogen bromide gas, a fluorine-containing gas and a hydrofluorocarbon gas and a second processing gas containing a hydrocarbon gas and a fluorocarbon gas are supplied from a first supply unit configured to supply a gas toward a central region of the processing target object and from a second supply unit configured to supply a gas toward an outer region than the central region such that a flow rate ratio of the second processing gas to the first processing gas supplied from the first supply unit is same as a flow rate ratio of the second processing gas to the first processing gas supplied from the second supply unit; the second processing gas is supplied from either one of the first supply unit and the second supply unit such that the flow rate ratio of the second processing gas to the first processing gas supplied from the first supply unit becomes different from the flow rate ratio of the second processing gas to the first processing gas supplied from the second supply unit; and the first processing gas and the second processing gas are excited.

2. The etching method of claim 1,
wherein the first supply unit is configured to supply the second processing gas.

3. The etching method of claim 1,
wherein the second supply unit is configured to supply the second processing gas.

4. The etching method of claim 1,
wherein the fluorocarbon gas is a $C_3F_8$ gas, a $C_4F_6$ gas or a $C_4F_8$ gas.

5. The etching method of claim 1,
wherein the hydrofluorocarbon gas is a $CH_2F_2$ gas, a $CH_3F$ gas or a $CHF_3$ gas.

6. The etching method of claim 1,
wherein the fluorine-containing gas is a $NF_3$ gas or a $SF_6$ gas.

7. The etching method of claim 1,
wherein the hydrocarbon gas is a $CH_4$ gas.

8. The etching method of claim 1,
wherein the first film is a silicon oxide film, and the second film is a silicon nitride film.

9. The etching method of claim 1,
wherein the first film is a silicon oxide film, and the second film is a polysilicon film.

10. The etching method of claim 1,
wherein the first film and the second film are stacked in twenty-four or more layers in total.

11. The etching method of claim 1,
wherein the mask is made of amorphous carbon.

* * * * *